(12) United States Patent
Ranieri et al.

(10) Patent No.: US 12,418,165 B2
(45) Date of Patent: Sep. 16, 2025

(54) CAPACITIVE FEEDTHROUGH FOR HYBRID HERMETIC MODULES FOR SPACE APPLICATIONS

(71) Applicant: Thales Alenia Space Italia S.p.A Con Unico Socio, Rome (IT)

(72) Inventors: Paolo Ranieri, Rome (IT); Antonio Salvato, Rome (IT); Elio Picchione, Rome (IT); Andrea Cafaggi, Rome (IT)

(73) Assignee: Thales Alenia Space Italia S.p.A. Con Unico Socio, Rome (IT)

( * ) Notice: Subject to any disclaimer, the term of this patent is extended or adjusted under 35 U.S.C. 154(b) by 270 days.

(21) Appl. No.: 18/017,310

(22) PCT Filed: Jul. 20, 2021

(86) PCT No.: PCT/IB2021/056550
§ 371 (c)(1),
(2) Date: Jan. 20, 2023

(87) PCT Pub. No.: WO2022/018634
PCT Pub. Date: Jan. 27, 2022

(65) Prior Publication Data
US 2023/0291191 A1    Sep. 14, 2023

(30) Foreign Application Priority Data
Jul. 20, 2020   (IT) .................. 102020000017554

(51) Int. Cl.
*H02G 3/22*  (2006.01)
*B64G 1/22*  (2006.01)
*H01G 4/30*  (2006.01)

(52) U.S. Cl.
CPC ................. *H02G 3/22* (2013.01); *B64G 1/22* (2013.01); *H01G 4/30* (2013.01)

(58) Field of Classification Search
CPC .......... H01G 4/30; H01G 4/248; H01G 4/232; H01G 4/005; H01G 4/008; B64G 1/22; H02G 3/22
(Continued)

(56) References Cited

U.S. PATENT DOCUMENTS

| 7,164,572 B1 | 1/2007 | Burdon et al. |
| 8,536,468 B2 * | 9/2013 | Teske .................. A61N 1/3754 174/650 |

(Continued)

FOREIGN PATENT DOCUMENTS

WO  PCT/IB2021/056550   7/2021

OTHER PUBLICATIONS

PCT International Search Report and Written Opinion dated Oct. 8, 2021 for PCT Application No. PCT/IB2021/056550.

*Primary Examiner* — Arun Ramaswamy
(74) *Attorney, Agent, or Firm* — McCarter & English, LLP

(57) ABSTRACT

A capacitive feedthrough hermetically sealable to a hybrid module for space applications is provided that includes a multilayer ceramic structure including, on the top face, a metallized top central region designed to receive an input electrical signal to be filtered, a dielectric top region extending around the metallized top central region, and a metallized top peripheral region extending around the dielectric top region up to joining the metallized external closed side walls to act therewith as electrical ground; and, on the bottom face, a metallized bottom central region designed to provide an output filtered electrical signal, a dielectric bottom region extending around the metallized bottom central region, and a metallized bottom peripheral region extending around the dielectric bottom region up to joining the metallized external closed side walls to act therewith as electrical ground. The multilayer ceramic structure further (Continued)

includes ceramic layers, first metallized layers and one or more second metallized layers stacked on one another such that: each first metallized layer is interposed between two respective ceramic layers arranged immediately on and below said first metallized layer; each/the second metallized layer is interposed between two respective ceramic layers arranged immediately on and below said second metallized layer; the first and second metallized layers are vertically alternated such that each/the second metallized layer has a respective upper first metallized layer arranged above said second metallized layer, and a respective lower first metallized layer arranged below said second metallized layer; and two ceramic layers are respectively arranged immediately below the top face and immediately above the bottom face.

13 Claims, 4 Drawing Sheets

(58) Field of Classification Search
USPC .................................. 361/301.4, 321.1, 302
See application file for complete search history.

(56) References Cited

U.S. PATENT DOCUMENTS

| | | |
|---|---|---|
| 2002/0166618 A1 | 11/2002 | Wolf et al. |
| 2005/0190527 A1 | 9/2005 | Stevenson et al. |
| 2020/0222691 A1* | 7/2020 | Stevenson ................ H01G 4/30 |

* cited by examiner

CAPACITIVE FEEDTHROUGH FOR HYBRID HERMETIC MODULES FOR SPACE APPLICATIONS

CROSS-REFERENCE TO RELATED APPLICATIONS

This patent application is a 35 U.S.C. § 371 National Stage filing of International Application No. PCT/IB2021/056550, filed on Jul. 20, 2021, which application claims priority from Italian patent application no. 102020000017554 filed on Jul. 20, 2020, the entire disclosures of which are incorporated herein by reference.

TECHNICAL FIELD OF THE INVENTION

The present invention relates, in general, to hermetically-sealed hybrid modules used for space applications (e.g., on board spacecraft, satellites, space platforms, etc.) and, more specifically, to a capacitive feedthrough that ensures electromagnetic interference (EMI) filtering and consequent electromagnetic compatibility (EMC) radiated emission performance adequate to hermetically-sealed hybrid modules, and that is hermetically sealable thereto.

STATE OF THE ART

As is known, nowadays hybrid modules are extensively used, in general, for space applications and, in particular, for onboard spacecraft electronics.

In particular, in the space sector, the terms "hermetically-sealed hybrid modules", "hybrid (hermetic) module", "hybrid microcircuit/circuit" or, simply, "(hermetic) hybrid" are typically used to refer to a combination of elements (e.g., one or more interconnection substrates, one or more active or passive elements, etc.) arranged inside a hermetically sealed package/housing/casing and designed to perform one or more predefined electronic functions, wherein:

- the interconnection substrates (e.g., thick or thin film substrates, cofired ceramic substrates, direct bonded copper (DBC) substrates, etc.) can be provided with or without integrated passive components (e.g., resistors, inductors, capacitors);
- the active elements can be monolithic or discrete, chips or packaged components; and
- the predefined electronic functions may include digital or analog functions, low frequency or radiofrequency (e.g., microwave) functions, low power or high power functions, and can be mixed depending on the specific application.

The main advantage of this technology is the use of naked die components which allows reducing:

- costs of procurement of the components; and
- electrical parasitic effects of packaged components which are critical when the modules operate at high frequency (e.g., GHz or higher frequencies).

Electromagnetic compatibility (EMC) radiated emission performance of a radiofrequency (RF) hybrid hermetic module (e.g., a microwave hybrid hermetic module) is mainly determined by effectiveness of electromagnetic shielding of the module. In this respect, a weak point of the electromagnetic shielding of hybrid modules is represented by direct current (DC) feedthroughs (i.e., elements designed and used to bring DC bias inside hybrid modules), which typically do not provide an adequate electromagnetic interference (EMI) filtering. Unfortunately, nowadays there is no real effective solution to the problem.

In fact, current feedthrough solutions used for hybrid modules are typically based on the use of a capacitive feedthrough that is arranged (e.g., by gluing or screwing) on a surface/wall as close as possible to an external wall of a hybrid module, and that is connected to the inside of the hybrid module via a non-capacitive feedthrough. However, this solution is only partial and substantially ineffective, since an EMI can be present in the region (typically a cavity) between the external wall of the hybrid module and the surface/wall where the capacitive feedthrough is arranged, whereby there is a risk that this interference will enter the hybrid module through the non-capacitive feedthrough. In fact, a non-capacitive feedthrough does not provide any actual EMI shielding, thereby representing a "breach" through which an EMI can enter a hybrid module.

Two main reasons prevent current capacitive feedthroughs from being arranged directly on hybrid module housings, namely:

- the high temperatures (e.g., brazing temperatures of approximately 300° C.) involved in the process of assembling hybrid modules, necessary to guarantee hermetic sealing thereof;
- the typical size/structure of known capacitive feedthroughs.

In fact, the above high temperatures affect reliability of current capacitive feedthroughs having internal glass-made parts that, after few heat treatment cycles, show cracks which are not acceptable from a quality standpoint.

It is worth noting that, nowadays, capacitive feedthroughs are also used in technical sectors different than the space one.

For example, US 2005/190527 A1 describes several feedthrough capacitor architectures for active implantable medical devices, wherein said feedthrough capacitor architectures are based on multilayer structures fitted with one or more hollow passageways provided with surface metallization and ending with metallized apertures on opposite faces of said multilayer structures.

In particular, US 2005/190527 A1 discloses a feedthrough terminal assembly for an active implantable medical device, wherein said feedthrough terminal assembly comprises: a feedthrough capacitor having an aperture therethrough; first and second sets of electrode plates alternated with dielectric layers, the second set of electrode plates being conductively coupled to a housing of the active implantable medical device; a terminal pin extending at least partially through the aperture; a conductive insert disposed within the aperture for conductively coupling the terminal pin and the first set of electrode plates and for mechanically coupling the terminal pin to the feedthrough capacitor; and surface metallization within the aperture for conductively coupling the first set of electrode plates; wherein the conductive insert is disposed between and physically contacts the terminal pin and the interior aperture surface metallization.

The solution according to US 2005/190527 A1 is specifically designed for use in cardiac pacemakers and cardioverter defibrillators and is applicable both to hermetically sealed housings and non-hermetically sealed housings and bulkheads.

Moreover, US 2005/190527 A1 states that the solution disclosed therein is theoretically applicable also to space electronic modules. However, the feedthrough capacitor architectures described in US 2005/190527 A1 do not actually provide EMI filtering performance suitable for space applications and require many elements, such as terminal pins, conductive inserts and conductive ferrules (necessary for signal propagation through the feedthrough capacitors), which complicate manufacturing process of such feedthrough capacitors.

Another example of hermetic feedthrough for implantable medical devices is also disclosed in U.S. Pat. No. 7,164,572 B1, which relates to multi-path, mono-polar co-fired hermetic electrical feedthroughs and methods of fabrication therefor. However, it is worth noting that the electrical feedthrough assembly according to U.S. Pat. No. 7,164,572 B1 is not capacitive and is absolutely unsuitable for space applications.

OBJECT AND SUMMARY OF THE INVENTION

In view of the foregoing, the Applicant has felt the need to carry out an in-depth study in order to develop an innovative capacitive feedthrough for space applications, in particular for use with hybrid hermetic modules, thereby conceiving the present invention.

Therefore, object of the present invention is that of providing a capacitive feedthrough for use with hybrid hermetic modules, in particular a capacitive feedthrough that ensures EMI filtering and consequent EMC radiated emission performance adequate to hybrid hermetic modules and that is hermetically sealable to a hybrid module for space applications.

This and other objects are achieved by the present invention in that it relates to a capacitive feedthrough hermetically sealable to a hybrid module for space applications, as defined in the appended claims.

In particular, the capacitive feedthrough according to the present invention comprises a multilayer ceramic structure that has:
two opposite external faces including a top face and bottom face; and
metallized external closed side walls vertically extending between said opposite external faces around the multilayer ceramic structure.

In particular, said multilayer ceramic structure includes:
on the top face,
a metallized top central region designed to receive an input electrical signal to be filtered,
a dielectric top region extending around the metallized top central region, and
a metallized top peripheral region extending around the dielectric top region up to joining the metallized external closed side walls to act therewith as electrical ground, wherein the dielectric top region is designed to ensure electrical insulation between the input electrical signal and the electrical ground; and,
on the bottom face,
a metallized bottom central region designed to provide an output filtered electrical signal, wherein said metallized top and bottom central regions are planar regions with no apertures,
a dielectric bottom region extending around the metallized bottom central region, and
a metallized bottom peripheral region extending around the dielectric bottom region up to joining the metallized external closed side walls to act therewith as electrical ground, wherein the dielectric bottom region is designed to ensure electrical insulation between the output filtered electrical signal and the electrical ground.

Additionally, the multilayer ceramic structure further includes ceramic layers, first metallized layers and one or more second metallized layers stacked on one another such that:
each first metallized layer is interposed between two respective ceramic layers arranged immediately on and below said first metallized layer;
each/the second metallized layer is interposed between two respective ceramic layers arranged immediately on and below said second metallized layer;
the first and second metallized layers are vertically alternated such that each/the second metallized layer has
a respective upper first metallized layer arranged above said second metallized layer, and
a respective lower first metallized layer arranged below said second metallized layer; and
two ceramic layers are respectively arranged immediately below the top face and immediately above the bottom face.

The first metallized layers are joined to the metallized external closed side walls, whereby said first metallized layers, said metallized external closed side walls and said metallized top and bottom peripheral regions form an electrical ground structure.

Each/the second metallized layer is separated from the metallized external closed side walls by a respective first dielectric gap designed to ensure electrical insulation between said second metallized layer and the electrical ground structure.

Each/the second metallized layer is connected to:
an upper second metallized layer, or the metallized top central region, by means of a respective first electrically conductive via that vertically extends between said second metallized layer and said upper second metallized layer/the metallized top central region through upper ceramic layers and the respective upper first metallized layer, wherein said respective first electrically conductive via is separated from said respective upper first metallized layer by a respective second dielectric gap extending around said respective first electrically conductive via, thereby forming a respective first capacitor; and
a lower second metallized layer, or the metallized bottom central region, by means of a respective second electrically conductive via that vertically extends between said second metallized layer and said lower second metallized layer/the metallized bottom central region through lower ceramic layers and the respective lower first metallized layer, wherein said respective second electrically conductive via is separated from said respective lower first metallized layer by a respective third dielectric gap extending around said respective second electrically conductive via, thereby forming a respective second capacitor.

The metallized top and bottom central regions and the second metallized layer(s) along with the respective electrically conductive vias and the respective capacitors form a capacitive feedthrough structure configured to receive the input electrical signal at/on the metallized top central region and to provide the output filtered electrical signal at/on the metallized bottom central region, whereby filtering of the input electrical signal is carried out by the capacitors.

BRIEF DESCRIPTION OF THE DRAWINGS

For a better understanding of the present invention, preferred embodiments, which are intended purely by way of non-limiting examples, will now be described with reference to the attached drawings (all not to scale), wherein.

DETAILED DESCRIPTION OF PREFERRED EMBODIMENTS OF THE INVENTION

The following description is presented to enable a person skilled in the art to make and use the invention. Various modifications to the embodiments will be readily apparent to those skilled in the art, without departing from the scope of the present invention as claimed. Thence, the present invention is not intended to be limited to the embodiments shown and described, but is to be accorded the widest scope of protection consistent with the features defined in the appended claims.

The present invention stems from Applicant's idea of using a multilayer ceramic substrate (preferably, a multilayer high temperature cofired ceramic (HTCC) or low temperature cofired ceramic (LTCC) substrate; conveniently, a multilayer HTCC/LTCC planar substrate) to make a capacitive feedthrough that provides EMI filtering and that can be hermetically sealed (conveniently, by means of a eutectic alloy) to an external wall of a hybrid module (in particular, an external wall of a housing/casing of a hybrid module), thereby resulting in an overall hermetic assembly provided with filtered DC bias access.

Therefore, more concisely, the present invention concerns the use of a multilayer ceramic substrate to make a hermetic, EMI filtering, capacitive feedthrough device that is hermetically sealable to a hybrid hermetic module.

Figure 1:
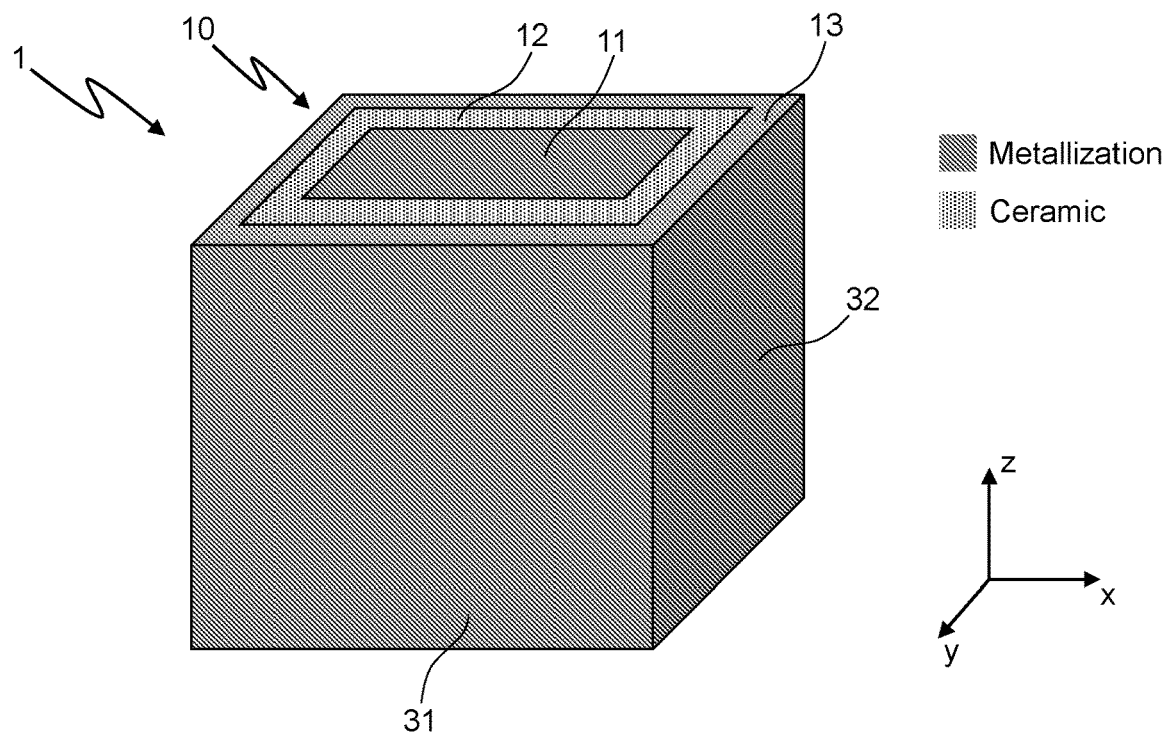
FIGS. 1-4 schematically illustrate an example of capacitive feedthrough according to a preferred, non-limiting embodiment of the present invention.
Figure 2:
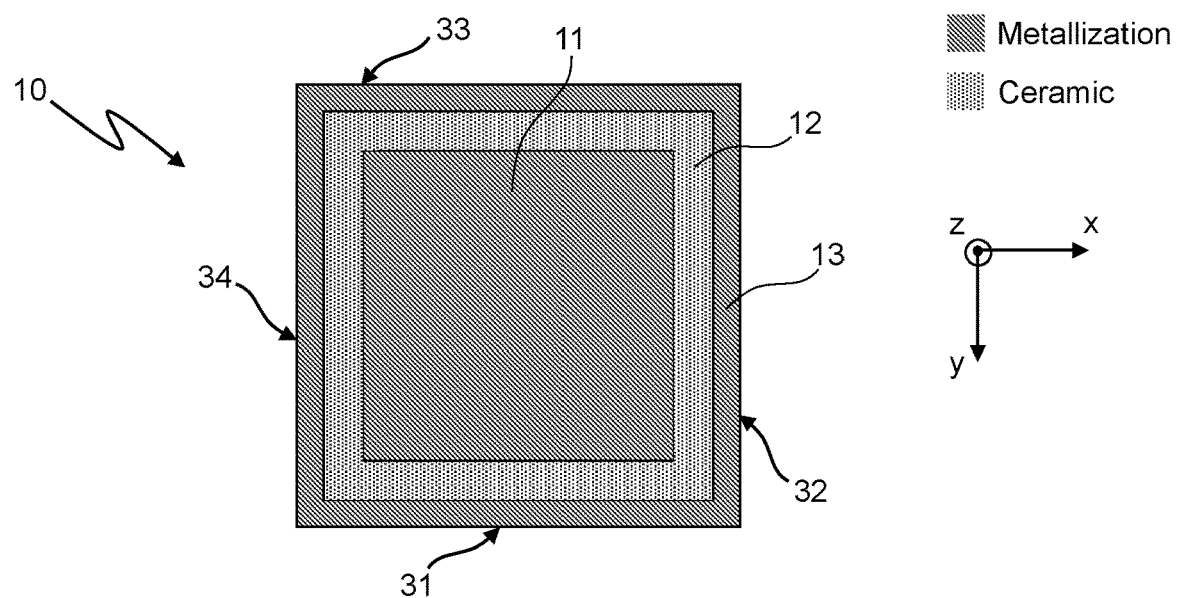
Figure 3:
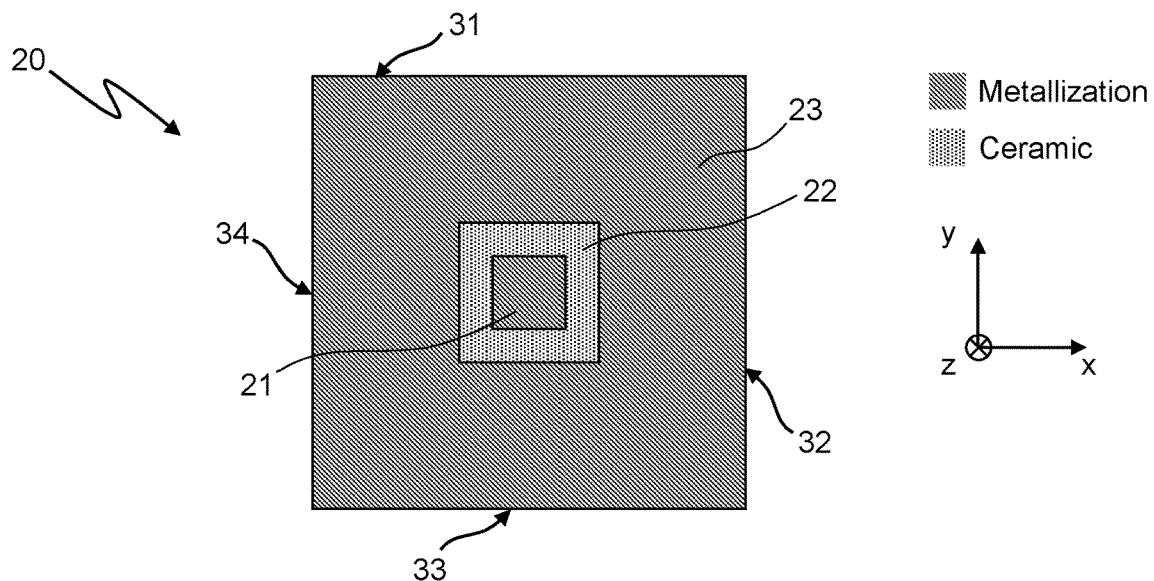
Figure 4:
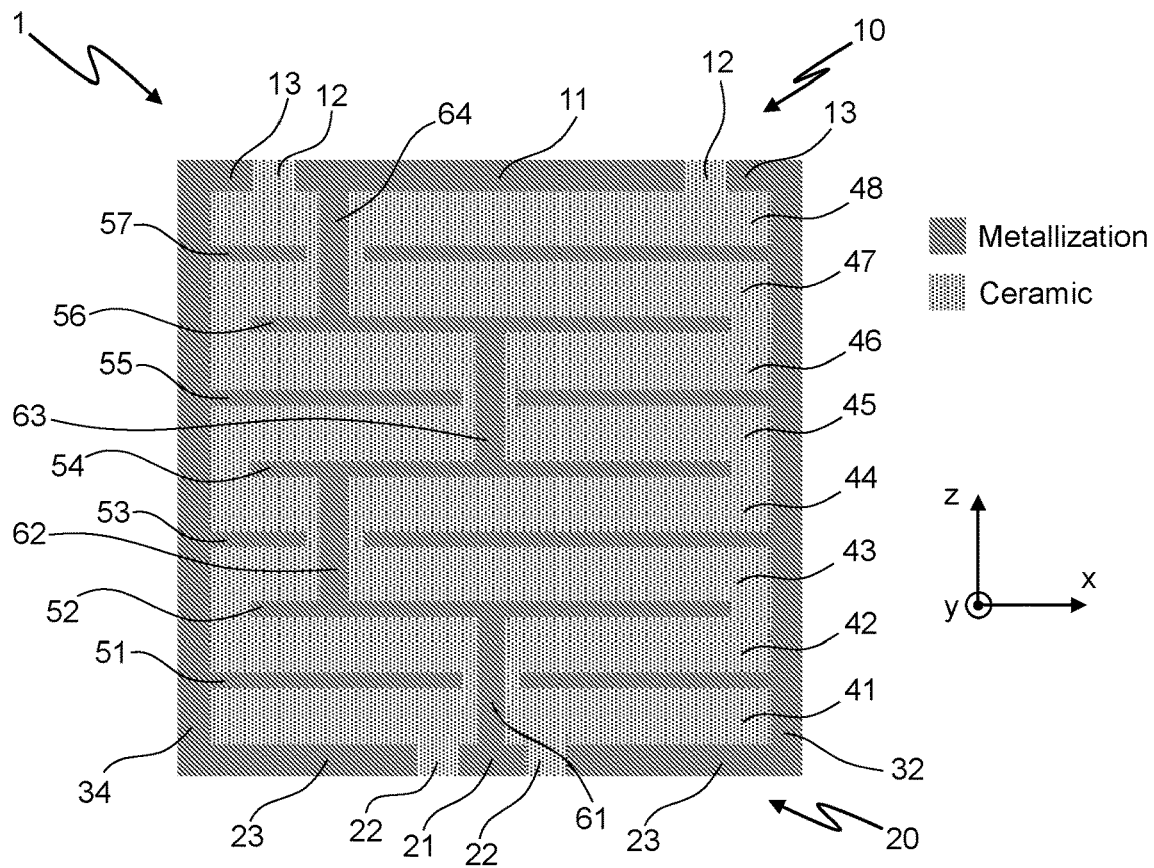

FIGS. 1-4 schematically illustrate an example of capacitive feedthrough (denoted as a whole by 1) according to a preferred, non-limiting embodiment of the present invention. In particular, FIG. 1 is a schematic perspective view of the capacitive feedthrough 1, FIG. 2 is a schematic top view thereof, FIG. 3 is a schematic bottom view thereof, and FIG. 4 is a schematic vertical cross-sectional view thereof.

As shown in FIG. 1-4, said capacitive feedthrough 1 comprises a multilayer ceramic structure (preferably, a multilayer HTCC or LTCC structure; conveniently, a multilayer HTCC/LTCC planar substrate) that is conveniently shaped as a cube or a rectangular cuboid (more in general, it might have the shape of a parallelepiped, a hexahedron, a prism, or a polyhedron), and that has:

two opposite external faces including a top face 10 and a bottom face 20; and
four metallized external closed side walls 31, 32, 33, 34 (conveniently, made of metallized ceramic material; preferably, gold-metallized ceramic material), that
vertically extend between the top face 10 and the bottom face 20,
extend around the multilayer ceramic structure, and are designed to act as electrical ground.

In particular, the multilayer ceramic structure includes:
on the top face 10,
a metallized top central region 11 (conveniently, made of metallized ceramic material; preferably, gold-metallized ceramic material), that is designed to receive an input electrical signal to be filtered (conveniently, a DC bias signal, such as an electrical voltage to be brought from outside to inside a hermetic hybrid—not shown in FIGS. 1-4), that is a planar region with no aperture, and that is conveniently square-shaped or rectangular-shaped,
a dielectric top region 12 (conveniently, made of non-metallized ceramic material), that extends around the metallized top central region 11 and is conveniently shaped as a square or rectangular frame, and
a metallized top peripheral region 13 (conveniently, made of metallized ceramic material; preferably, gold-metallized ceramic material), that extends around the dielectric top region 12 up to joining the metallized external closed side walls 31, 32, 33, 34 to act therewith as electrical ground (wherein the dielectric top region 12 is designed to ensure electrical insulation between the input electrical signal and the electrical ground), and that is conveniently shaped as a square or rectangular frame; and,
on the bottom face 20,
a metallized bottom central region 21 (conveniently, made of metallized ceramic material; preferably, gold-metallized ceramic material), that is designed to provide an output filtered electrical signal, that is a planar region with no aperture, and that is conveniently square-shaped or rectangular-shaped,
a dielectric bottom region 22 (conveniently, made of non-metallized ceramic material), that extends around the metallized bottom central region 21 and is conveniently shaped as a square or rectangular frame, and
a metallized bottom peripheral region 23 (conveniently, made of metallized ceramic material; preferably, gold-metallized ceramic material), that extends around the dielectric bottom region 22 up to joining the metallized external closed side walls 31, 32, 33, 34 to act therewith as electrical ground (wherein the dielectric bottom region 22 is designed to ensure electrical insulation between the output filtered electrical signal and the electrical ground), and that is conveniently shaped as a square or rectangular frame.

As shown in FIGS. 2-4, the metallized top central region 11 is larger than the metallized bottom central region 21, whereas the metallized bottom peripheral region 23 is larger than the metallized top peripheral region 13.

Furthermore, as shown in FIG. 4, the multilayer ceramic structure includes eight (internal) ceramic layers and seven (internal) metallized layers (conveniently, made of metallized ceramic material; preferably, gold-metallized ceramic material) that are stacked on one another such that:

a first ceramic layer 41 is arranged (i.e., extends) on the metallized bottom central region 21, the dielectric bottom region 22 and the metallized bottom peripheral region 23;
a first metallized layer 51 is arranged (i.e., extends) on the first ceramic layer 41;
a second ceramic layer 42 is arranged (i.e., extends) on the first metallized layer 51;
a second metallized layer 52 is arranged (i.e., extends) on the second ceramic layer 42;
a third ceramic layer 43 is arranged (i.e., extends) on the second metallized layer 52;
a third metallized layer 53 is arranged (i.e., extends) on the third ceramic layer 43;
a fourth ceramic layer 44 is arranged (i.e., extends) on the third metallized layer 53;

a fourth metallized layer 54 is arranged (i.e., extends) on the fourth ceramic layer 44;

a fifth ceramic layer 45 is arranged (i.e., extends) on the fourth metallized layer 54;

a fifth metallized layer 55 is arranged (i.e., extends) on the fifth ceramic layer 45;

a sixth ceramic layer 46 is arranged (i.e., extends) on the fifth metallized layer 55;

a sixth metallized layer 56 is arranged (i.e., extends) on the sixth ceramic layer 46;

a seventh ceramic layer 47 is arranged (i.e., extends) on the sixth metallized layer 56;

a seventh metallized layer 57 is arranged (i.e., extends) on the seventh ceramic layer 47; and an eighth ceramic layer 48 is arranged (i.e., extends) on the seventh metallized layer 57 between said seventh metallized layer 57 and the metallized top central region 11, the dielectric top region 12 and the metallized top peripheral region 13.

The first, third, fifth and seventh metallized layers 51, 53, 55, 57 are joined/connected to the metallized external closed side walls 31, 32, 33, 34, whereby said first, third, fifth and seventh metallized layers 51, 53, 55, 57, said metallized external closed side walls 31, 32, 33, 34, said metallized top peripheral region 13 and said metallized bottom peripheral region 23 form an electrical ground structure.

Instead, each of the second, fourth and sixth metallized layers 52, 54, 56 is separated from the metallized external closed side walls 31, 32, 33, 34 by a respective first dielectric gap (conveniently, made of non-metallized ceramic material) extending around said second/fourth/sixth metallized layer 52/54/56 between said second/fourth/sixth metallized layer 52/54/56 and the metallized external closed side walls 31, 32, 33, 34.

Moreover, the second metallized layer 52 is electrically connected to the metallized bottom central region 21 by means of a first electrically conductive via 61 (e.g., made of gold), that:

vertically extends between said second metallized layer 52 and said metallized bottom central region 21 through the second ceramic layer 42, the first metallized layer 51 and the first ceramic layer 41; and is separated from the first metallized layer 51 by a second dielectric gap (conveniently, made of non-metallized ceramic material) extending around said first electrically conductive via 61 between said first electrically conductive via 61 and the first metallized layer 51, thereby forming a first capacitor.

The fourth metallized layer 54 is electrically connected to the second metallized layer 52 by means of a second electrically conductive via 62 (e.g., made of gold), that:

vertically extends between said fourth metallized layer 54 and said second metallized layer 52 through the fourth ceramic layer 44, the third metallized layer 53 and the third ceramic layer 43; and is separated from the third metallized layer 53 by a third dielectric gap (conveniently, made of non-metallized ceramic material) extending around said second electrically conductive via 62 between said second electrically conductive via 62 and the third metallized layer 53, thereby forming a second capacitor.

The sixth metallized layer 56 is electrically connected to the fourth metallized layer 54 by means of a third electrically conductive via 63 (e.g., made of gold), that:

vertically extends between said sixth metallized layer 56 and said fourth metallized layer 54 through the sixth ceramic layer 46, the fifth metallized layer 55 and the fifth ceramic layer 45; and is separated from the fifth metallized layer 55 by a fourth dielectric gap (conveniently, made of non-metallized ceramic material) extending around said third electrically conductive via 63 between said third electrically conductive via 63 and the fifth metallized layer 55, thereby forming a third capacitor.

Furthermore, the sixth metallized layer 56 is electrically connected also to the metallized top central region 11 by means of a fourth electrically conductive via 64 (e.g., made of gold), that:

vertically extends between said sixth metallized layer 56 and said metallized top central region 11 through the seventh ceramic layer 47, the seventh metallized layer 57 and the eighth ceramic layer 48; and is separated from the seventh metallized layer 57 by a fifth dielectric gap (conveniently, made of non-metallized ceramic material) extending around said fourth electrically conductive via 64 between said fourth electrically conductive via 64 and the seventh metallized layer 57, thereby forming a fourth capacitor.

Therefore, the metallized top and bottom central regions 11, 21, the second, fourth and sixth metallized layers 52, 54, 56, the first, second, third and fourth electrically conductive vias 61, 62, 63, 64 and the corresponding first, second, third and fourth capacitors form a capacitive feedthrough structure configured to receive an input electrical signal (conveniently, a DC bias signal, such as an electrical voltage to be brought from outside to inside a hermetic hybrid) at/on the metallized top central region 11, and to output a corresponding filtered electrical signal at/on the metallized bottom central region 21, wherein the input electrical signal is filtered by said first, second, third and fourth capacitors.

Figure 5:
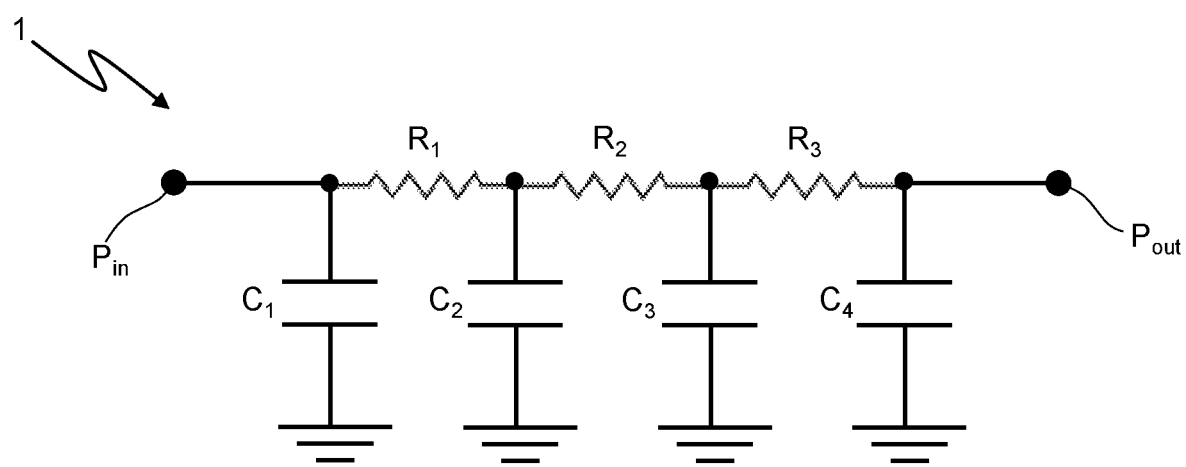
FIG. 5 shows a schematic circuit diagram of the capacitive feedthrough of FIGS. 1-4.

In this connection, FIG. 5 shows a schematic circuit diagram of the capacitive feedthrough 1, including:

an input terminal/port $P_{in}$ schematically representing the metallized top central region 11;

an output terminal/port $P_{out}$ schematically representing the metallized bottom central region 21; and a series of three resistors $R_1$, $R_2$, $R_3$ interconnected with four shunt capacitors $C_1$, $C_2$, $C_3$, $C_4$, which schematically represent the previously described capacitive feedthrough structure.

Therefore, as previously explained, an input electrical signal received at the input terminal/port $P_{in}$ is filtered by the shunt capacitors $C_1$, $C_2$, $C_3$, $C_4$, whereby a corresponding filtered electrical signal is provided at the output terminal/port $P_{out}$.

In this way, an EMI affecting a DC bias signal to be provided to a hybrid module is filtered out by the capacitive feedthrough 1, which is, thence, provided with the capability to supply a hybrid module with an EMI-free DC bias signal.

Conveniently, the capacitive feedthrough 1 can be hermetically sealed to/on a wall of a housing/casing of a hybrid module by using a eutectic alloy having a predefined melting temperature (e.g., 300/320° C.).

Figure 6:
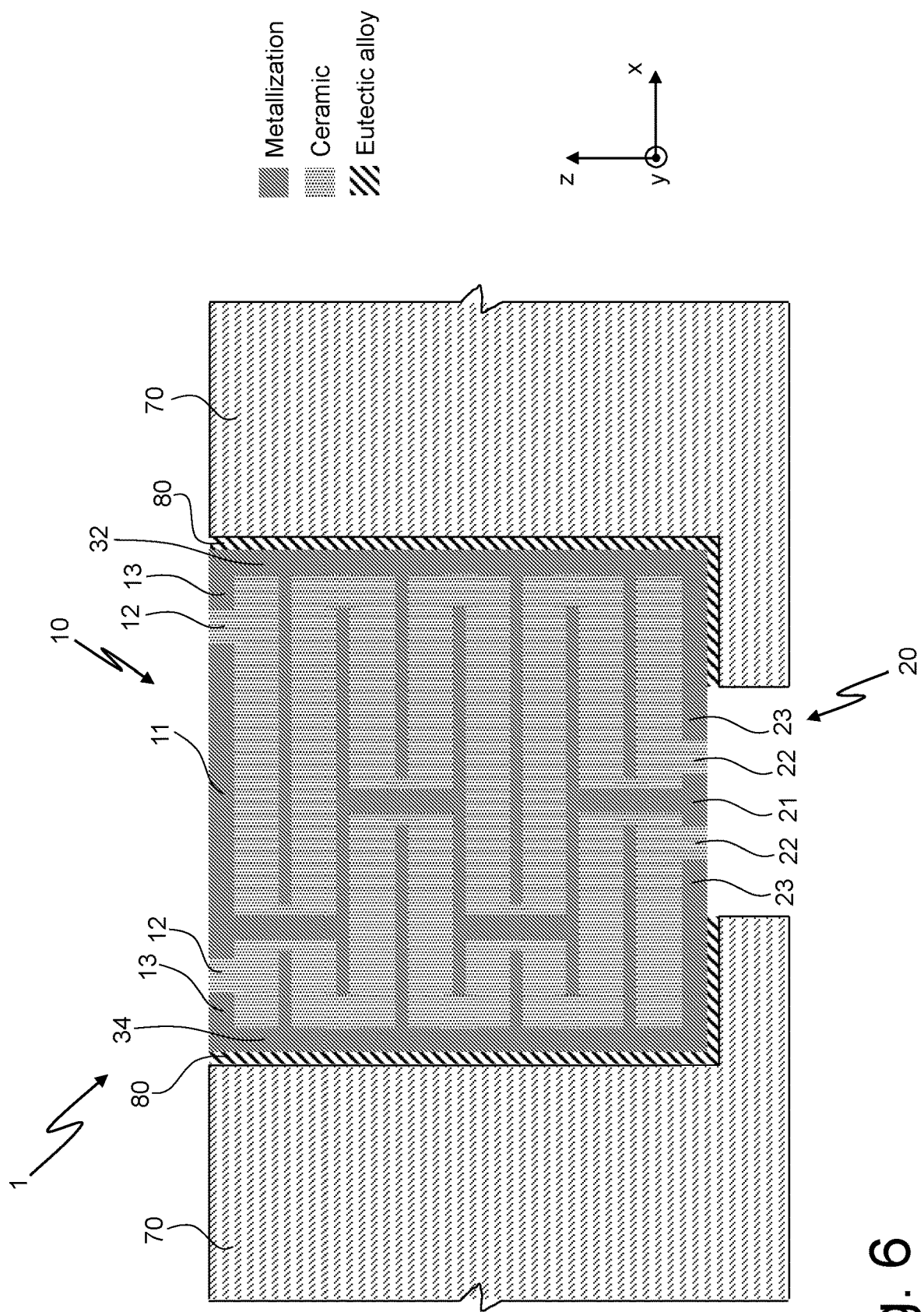
FIG. 6 schematically illustrates an example of hermetic sealing of the capacitive feedthrough of FIGS. 1-4 to a hybrid module.

In this connection, FIG. 6 schematically illustrates an example of hermetic sealing of the capacitive feedthrough 1 to a hybrid module. In particular, FIG. 6 is a schematic vertical cross-sectional view of the capacitive feedthrough 1 embedded in a cavity formed on an external (metal) side wall (denoted by 70) of a (metal) housing/casing of a hybrid module (not shown in FIG. 6).

The capacitive feedthrough 1 is hermetically sealed to the hybrid module's external side wall 70 by means of a eutectic alloy 80 (e.g., a gold-tin (AuSn) alloy) that is:
interposed between
the hybrid module's external side wall 70 (in particular, the portion(s) thereof forming the cavity in which the capacitive feedthrough 1 is arranged/inserted) and
the metallized external closed side walls 31, 32, 33, 34 of the capacitive feedthrough 1 and, partially, the bottom face 20 thereof (in particular, only a portion of the metallized bottom peripheral region 23); and
heated, along with the hybrid module and the capacitive feedthrough 1, to a predefined temperature (e.g., 320° C.) such that to cause said eutectic alloy 80 to melt, thereby forming a hermetic sealing between the capacitive feedthrough 1 and the hybrid module's external side wall 70.

More specifically, said capacitive feedthrough 1 is arranged/inserted in the cavity formed by the hybrid module's external side wall 70 such that the bottom face 20 faces towards the inside of the hybrid module, whereas the top face 10 faces towards the outside of said hybrid module.

Conveniently, a wire (not shown in FIG. 6) could be soldered onto the metallized top central region 11 (for example, by means of an indium-lead (InPb) solder alloy) to provide the capacitive feedthrough 1 with the input electrical signal to be filtered and, then, supplied to the hybrid module. To this end, an American wire gauge (AWG) wire might be conveniently used, whose diameter can be determined based on the current of the input electrical signal.

Additionally, a microwire (not shown in FIG. 6) could be conveniently soldered onto the metallized bottom central region 21 (for example, by thermo-compression) to receive the filtered electrical signal provided by the capacitive feedthrough 1 (wherein the diameter of the microwire is smaller than the diameter of the wire soldered on the top face 10).

The sealing of the capacitive feedthrough 1 might be conveniently based also on other alloys different than AuSn alloy (and having different melting temperatures), such as a gold-germanium (AuGe) alloy.

As previously explained, the capacitive feedthrough 1 represents only a non-limiting example according to a preferred (again non-limiting) embodiment of the present invention.

In this respect, it is worth noting that a capacitive feedthrough according to a more general embodiment of the present invention comprises a multilayer ceramic structure that has:
two opposite external faces including an apertureless top face and an apertureless bottom face; and
metallized external closed side walls vertically extending between said opposite external faces around the multilayer ceramic structure.

In particular, said multilayer ceramic structure includes:
on the top face,
a metallized top central region that is designed to receive an input electrical signal to be filtered and that is a planar region with no aperture,
a dielectric top region extending around the metallized top central region, and
a metallized top peripheral region extending around the dielectric top region up to joining the metallized external closed side walls to act therewith as electrical ground, wherein the dielectric top region is designed to ensure electrical insulation between the input electrical signal and the electrical ground; and,
on the bottom face,
a metallized bottom central region that is designed to provide an output filtered electrical signal and that is a planar region with no aperture,
a dielectric bottom region extending around the metallized bottom central region, and
a metallized bottom peripheral region extending around the dielectric bottom region up to joining the metallized external closed side walls to act therewith as electrical ground, wherein the dielectric bottom region is designed to ensure electrical insulation between the output filtered electrical signal and the electrical ground.

Additionally, the multilayer ceramic structure further includes (four or more) ceramic layers, (two or more) first metallized layers and one or more second metallized layers stacked on one another such that:
each first metallized layer is interposed between two respective ceramic layers arranged immediately on and below said first metallized layer;
each/the second metallized layer is interposed between two respective ceramic layers arranged immediately on and below said second metallized layer;
the first and second metallized layers are vertically alternated such that each/the second metallized layer has
a respective upper first metallized layer arranged above said second metallized layer, and
a respective lower first metallized layer arranged below said second metallized layer; and
two ceramic layers are respectively arranged immediately below the top face and immediately above the bottom face.

The first metallized layers are joined to the metallized external closed side walls, whereby said first metallized layers, said metallized external closed side walls and said metallized top and bottom peripheral regions form an electrical ground structure.

Each/the second metallized layer is separated from the metallized external closed side walls by a respective first dielectric gap designed to ensure electrical insulation between said second metallized layer and the electrical ground structure.

Each/the second metallized layer is connected to:
an upper second metallized layer, or the metallized top central region, by means of a respective first electrically conductive via that vertically extends between said second metallized layer and said upper second metallized layer/the metallized top central region through upper ceramic layers and the respective upper first metallized layer, wherein said respective first electrically conductive via is separated from said respective upper first metallized layer by a respective second dielectric gap extending around said respective first electrically conductive via, thereby forming a respective first capacitor; and
a lower second metallized layer, or the metallized bottom central region, by means of a respective second electrically conductive via that vertically extends between said second metallized layer and said lower second metallized layer/the metallized bottom central region through lower ceramic layers and the respective lower first metallized layer, wherein said respective second electrically conductive via is separated from said respective lower first metallized layer by a respective third dielectric gap extending around said respective second electrically conductive via, thereby forming a respective second capacitor.

The metallized top and bottom central regions and the second metallized layer(s) along with the respective electrically conductive vias and the respective capacitors form a capacitive feedthrough structure configured to receive the input electrical signal at/on the metallized top central region and to provide the output filtered electrical signal at/on the metallized bottom central region, whereby filtering of the input electrical signal is carried out by the capacitors.

It is worth noting that the capacitive feedthrough according to the present invention can be advantageously used not only for DC signals, but also for low frequency signals, such as modulation signals. For example, the capacitive feedthrough might be conveniently designed to perform a predefined low-pass filtering (e.g., up to 100 MHz), thereby enabling its use for both DC signals and low frequency signals (e.g., modulation signals).

In view of the foregoing, technical advantages and innovative features of the present invention are immediately clear to those skilled in the art.

In particular, it is important to stress the point that the present invention allows making an overall hermetic assembly that:
includes a hybrid hermetic module and a multilayer-ceramic-substrate-based, EMI filtering, capacitive feedthrough device hermetically sealed thereto (conveniently, by means of a eutectic alloy); and
is, thence, provided with filtered DC bias access.

To this end, the present invention teaches to use a multilayer ceramic substrate (preferably, a multilayer HTCC/LTCC substrate; conveniently, a multilayer HTCC/LTCC planar substrate) that can be conveniently brazed on an external (metal) wall of a hybrid module (for example, at 320° C.) without any reliability issue, thereby ensuring the hermetic sealing level required for space applications.

The internal layers of the multilayer ceramic substrate are advantageously exploited to make a capacitive feedthrough structure (with metallic planes parallel to each other). In particular, the shape and the size of each internal metallic plane can be conveniently designed with a three-dimensional (3D) electromagnetic simulator in order to tune/optimize the filtering performed by the capacitive feedthrough (for example, as previously explained, to allow its use not only for DC signals, but also for low frequency signals, such as modulation signals).

It is worth noting that the use of a capacitive feedthrough structure based on a multilayer ceramic substrate as EMI filter hermetically sealed on the housing of a hybrid module to solve the issue of EMC/EMI shielding of the hybrid module is innovative, wherein the present invention enables device size miniaturization thanks to the reduced dimensions compared to conventional capacitive non-hermetic feedthroughs. For example, the present invention allows conveniently using a parallelepiped-shaped multilayer HTCC substrate with 2.75×2.75×2.5 mm size, whereas conventional glass capacitive feedthroughs envelope dimensions are in the order of 4×4×20 mm.

Additionally, it is important to note that, contrary to the feedthrough capacitor architectures described in US 2005/190527 A1, the capacitive feedthrough structure according to the present invention provides excellent EMI filtering performance, in particular EMI filtering performance adequate to space applications, and does not require the additional elements of said feedthrough capacitor architectures disclosed in US 2005/190527 A1 (such as hollow passageways with surface metallization and metallized apertures, terminal pins, conductive inserts and conductive ferrules), whereby the manufacturing process of the capacitive feedthrough structure according to the present invention is much simpler.

In conclusion, it is clear that numerous modifications and variants can be made to the present invention, all falling within the scope of the invention, as defined in the appended claims.

The invention claimed is:

1. Hermetic assembly for space applications, comprising:
a hybrid hermetic module; and
a capacitive feedthrough (1) comprising a multilayer ceramic structure that has:
two opposite external faces including a top face (10) and bottom face (20); and
metallized external closed side walls (31, 32, 33, 34) vertically extending between said opposite external faces (10,20) around the multilayer ceramic structure;
said multilayer ceramic structure including:
on the top face (10),
a metallized top central region (11) designed to receive an input electrical signal to be filtered,
a dielectric top region (12) extending around the metallized top central region (11), and
a metallized top peripheral region (13) extending around the dielectric top region (12) up to joining the metallized external closed side walls (31, 32, 33, 34) to act therewith as electrical ground, wherein the dielectric top region (12) is designed to ensure electrical insulation between the input electrical signal and the electrical ground; and,
on the bottom face (20),
a metallized bottom central region (21) designed to provide an output filtered electrical signal,
a dielectric bottom region (22) extending around the metallized bottom central region (21), and
a metallized bottom peripheral region (23) extending around the dielectric bottom region (22) up to joining the metallized external closed side walls (31, 32, 33, 34) to act therewith as electrical ground, wherein the dielectric bottom region (22) is designed to ensure electrical insulation between the output filtered electrical signal and the electrical ground;
the multilayer ceramic structure further including ceramic layers (41, 42, 43, 44, 45, 46, 47, 48), first metallized layers (51, 53, 55, 57) and one or more second metallized layers (52, 54, 56) stacked on one another such that:
each first metallized layer (51, 53, 55, 57) is interposed between two respective ceramic layers (41, 42, 43, 44, 45, 46, 47, 48) arranged immediately on and below said first metallized layer (51, 53, 55, 57);
each/the second metallized layer (52, 54, 56) is interposed between two respective ceramic layers (42, 43, 44, 45, 46, 47) arranged immediately on and below said second metallized layer (52, 54, 56);
the first and second metallized layers (51, 52, 53, 54, 55, 56, 57) are vertically alternated such that each/the second metallized layer (52, 54, 56) has
a respective upper first metallized layer (53, 55, 57) arranged above said second metallized layer (52, 54, 56), and
a respective lower first metallized layer (51, 53, 55) arranged below said second metallized layer (52, 54, 56); and
two ceramic layers (41, 48) are respectively arranged immediately below the top face (10) and immediately above the bottom face (11);

wherein the first metallized layers (51, 53, 55, 57) are joined to the metallized external closed side walls (31, 32, 33, 34), whereby said first metallized layers (51, 53, 55, 57), said metallized external closed side walls (31, 32, 33, 34) and said metallized top and bottom peripheral regions (13, 23) form an electrical ground structure;

wherein each/the second metallized layer (52, 54, 56) is separated from the metallized external closed side walls (31, 32, 33, 34) by a respective first dielectric gap designed to ensure electrical insulation between said second metallized layer (52, 54, 56) and the electrical ground structure;

wherein each/the second metallized layer (52, 54, 56) is connected to:

an upper second metallized layer (52, 54, 56), or the metallized top central region (11), by means of a respective first electrically conductive via (62, 63, 64) that vertically extends between said second metallized layer (52, 54, 56) and said upper second metallized layer (52, 54, 56)/the metallized top central region (11) through upper ceramic layers (43, 44, 45, 46, 47, 48) and the respective upper first metallized layer (53, 55, 57), wherein said respective first electrically conductive via (62, 63, 64) is separated from said respective upper first metallized layer (53, 55, 57) by a respective second dielectric gap extending around said respective first electrically conductive via (62, 63, 64), thereby forming a respective first capacitor; and a lower second metallized layer (52, 54, 56), or the metallized bottom central region (21), by means of a respective second electrically conductive via (61, 62, 63) that vertically extends between said second metallized layer (52, 54, 56) and said lower second metallized layer (52, 54, 56)/the metallized bottom central region (21) through lower ceramic layers (41, 42, 43, 44, 45, 46) and the respective lower first metallized layer (51, 53, 55), wherein said respective second electrically conductive via (61, 62, 63) is separated from said respective lower first metallized layer (51, 53, 55) by a respective third dielectric gap extending around said respective second electrically conductive via (61, 62, 63), thereby forming a respective second capacitor;

and wherein the metallized top and bottom central regions (11, 21) and the second metallized layer(s) (52, 54, 56) along with the respective electrically conductive vias (61, 62, 63, 64) and the respective capacitors form a capacitive feedthrough structure configured to receive the input electrical signal at/on the metallized top central region (11) and to provide the output filtered electrical signal at/on the metallized bottom central region (21), whereby filtering of the input electrical signal is carried out by the capacitors;

characterized in that the metallized top and bottom central regions (11, 21) are planar regions with no apertures, wherein said capacitive feedthrough (1) is hermetically sealed to the hybrid hermetic module by means of a eutectic alloy (80).

2. The hermetic assembly of claim 1, wherein the metallized top central region (11) of the capacitive feedthrough is larger than the metallized bottom central region (21), and the metallized bottom peripheral region (23) is larger than the metallized top peripheral region (13).

3. The hermetic assembly of claim 1, wherein the multilayer ceramic structure of the capacitive feedthrough includes four or more ceramic layers (41, 42, 43, 44, 45, 46, 47, 48) and two or more first metallized layers (51, 53, 55, 57).

4. The hermetic assembly of claim 1, wherein the multilayer ceramic structure of the capacitive feedthrough is a multilayer high or low temperature cofired ceramic substrate.

5. The hermetic assembly of claim 4, wherein the multilayer ceramic structure of the capacitive feedthrough is a multilayer high/low temperature cofired ceramic planar substrate.

6. The hermetic assembly of claim 1, wherein the metallized external closed side walls (31, 32, 33, 34), the metallized top and bottom central regions (11, 21), the metallized top and bottom peripheral regions (13, 23) and the first and second metallized layers (51, 52, 53, 54, 55, 56, 57) of the capacitive feedthrough are made of metallized ceramic material.

7. The hermetic assembly of claim 6, wherein the metallized external closed side walls (31, 32, 33, 34), the metallized top and bottom central region (11, 21), the metallized top and bottom peripheral region (13, 23) and the first and second metallized layers (51, 52, 53, 54, 55, 56, 57) of the capacitive feedthrough are made of gold-metallized ceramic material.

8. The hermetic assembly of claim 1, wherein the dielectric top and bottom regions (12, 22) of the capacitive feedthrough are made of non-metallized ceramic material; and wherein, for each/the second metallized layer (52, 54, 56), the respective first, second and third dielectric gaps of the capacitive feedthrough are made of non-metallized ceramic material.

9. The hermetic assembly of claim 1, wherein, for each/the second metallized layer (52, 54, 56), the respective electrically conductive vias (61, 62, 63, 64) of the capacitive feedthrough are made of gold.

10. The hermetic assembly of claim 1, wherein the capacitive feedthrough (1) is hermetically sealed to the hybrid hermetic module such that the bottom face (20) of said capacitive feedthrough (1) faces towards the inside of the hybrid module and the top face (10) of said capacitive feedthrough (1) faces towards the outside of said hybrid module.

11. The hermetic assembly according to claim 1, wherein the eutectic alloy (80) is a gold-tin or gold-germanium alloy.

12. Space platform including the hermetic assembly as claimed in claim 1.

13. The space platform of claim 12, wherein said space platform is a satellite, a spacecraft, a space station, or a space vehicle.

* * * * *